United States Patent
Yamamoto

(10) Patent No.: US 10,622,504 B2
(45) Date of Patent: Apr. 14, 2020

(54) PHOTODETECTOR CIRCUIT AND PHOTODETECTOR DEVICE

(71) Applicant: JOLED INC., Tokyo (JP)

(72) Inventor: Tetsuro Yamamoto, Tokyo (JP)

(73) Assignee: JOLED INC., Tokyo (JP)

(*) Notice: Subject to any disclaimer, the term of this patent is extended or adjusted under 35 U.S.C. 154(b) by 287 days.

(21) Appl. No.: 15/868,577

(22) Filed: Jan. 11, 2018

(65) Prior Publication Data

US 2018/0204971 A1   Jul. 19, 2018

(30) Foreign Application Priority Data

Jan. 19, 2017   (JP) .................... 2017-007867

(51) Int. Cl.
| | |
|---|---|
| H01L 27/00 | (2006.01) |
| H01L 31/113 | (2006.01) |
| H01L 27/144 | (2006.01) |
| G01J 1/46 | (2006.01) |
| G01T 1/24 | (2006.01) |
| H01L 31/02 | (2006.01) |
| G01T 1/208 | (2006.01) |
| G01J 1/44 | (2006.01) |

(52) U.S. Cl.
CPC ............ H01L 31/1136 (2013.01); G01J 1/46 (2013.01); G01T 1/208 (2013.01); G01T 1/247 (2013.01); H01L 27/1446 (2013.01); H01L 31/02019 (2013.01); G01J 2001/448 (2013.01)

(58) Field of Classification Search
CPC ..... G01T 1/208; G01T 1/247; H01L 31/1136; H01L 27/1446; H01L 31/02019; G01J 1/46

USPC ........................................ 250/208.1; 345/81
See application file for complete search history.

(56) References Cited

U.S. PATENT DOCUMENTS

| | | | | |
|---|---|---|---|---|
| 7,502,001 B2* | 3/2009 | Fish | ...................... | G09G 3/3233 |
| | | | | 345/207 |
| 2007/0262238 A1* | 11/2007 | Takashima | ............. | H04N 3/155 |
| | | | | 250/208.1 |

(Continued)

FOREIGN PATENT DOCUMENTS

| | | | | |
|---|---|---|---|---|
| EP | 1785979 A2 * | 5/2007 | ........... | G09G 3/3233 |
| JP | 2010-286814 | 12/2010 | | |

*Primary Examiner* — Georgia Y Epps
*Assistant Examiner* — Kevin Wyatt
(74) *Attorney, Agent, or Firm* — Greenblum & Bernstein, P.L.C.

(57) ABSTRACT

A photodetector circuit includes: a photodetector transistor; a current output transistor; a switching transistor; and a first capacitor. The source of the photodetector transistor, the gate of the current output transistor, and the first terminal of the first capacitor are connected to one another. The source of the current output transistor, the drain of the switching transistor, and the second terminal of the first capacitor are connected to one another. The photodetector transistor has a drain connected to a reference potential line, and upon receiving light when the photodetector transistor is in an off state, the source of the photodetector transistor collects electric charges generated by an internal photoelectric effect. The current output transistor has a drain connected to a power line which can have a first power supply potential and a second power supply potential. The switching transistor has a source connected to a photodetection line.

8 Claims, 20 Drawing Sheets

(56) References Cited

U.S. PATENT DOCUMENTS

2009/0315877 A1* 12/2009 Deane ................. G09G 3/3233
                                                                       345/214
2010/0289829 A1* 11/2010 Yamamoto ........... G09G 3/3233
                                                                       345/690

* cited by examiner

PHOTODETECTOR CIRCUIT AND PHOTODETECTOR DEVICE

CROSS REFERENCE TO RELATED APPLICATION

The present application is based on and claims priority of Japanese Patent Application No. 2017-007867 filed on Jan. 19, 2017. The entire disclosure of the above-identified application, including the specification, drawings and claims is incorporated herein by reference in its entirety.

FIELD

The present disclosure relates to a photodetector circuit and a photodetector device which convert received light into an electric signal.

BACKGROUND

A photodetector circuit is conventionally known which stores electric charges generated by the internal photoelectric effect and outputs a pixel value corresponding to the amount of the stored charge.

For example, Patent Literature (PTL) 1 discloses a photodetector circuit including a plurality of metal oxide semiconductor (MOS) transistors.

CITATION LIST

Patent Literature

[PTL 1] Japanese Unexamined Patent Application Publication No. 2010-286814

SUMMARY

Technical Problem

However, in the conventional photodetector circuit, a change in characteristics of the MOS transistors included in the circuit caused due to, for example, time degradation leads to a change in circuit characteristics of the photodetector circuit.

The present disclosure has been conceived in view of the above problem. An object of the present disclosure is to provide a photodetector circuit and a photodetector device which can reduce changes in circuit characteristics caused due to the changes in characteristics of the transistors, compared to a conventional technology.

Solution to Problem

A photodetector circuit according to an aspect of the present disclosure includes: a photodetector transistor; a current output transistor; a switching transistor; and a first capacitor. A source of the photodetector transistor, a gate of the current output transistor, and a first terminal of the first capacitor are connected to one another. A source of the current output transistor, a drain of the switching transistor, and a second terminal of the first capacitor are connected to one another. The photodetector transistor has a drain connected to a reference potential line, and upon receiving light when the photodetector transistor is in an off state, the source of the photodetector transistor collects electric charges generated by an internal photoelectric effect. The current output transistor has a drain connected to a power line which can have a first power supply potential and a second power supply potential. The switching transistor has a source connected to a photodetection line.

A photodetector device according to an aspect of the present disclosure includes a photodetector circuit array including a plurality of the photodetector circuits arrayed two-dimensionally in N rows and M columns, each of N and M being an integer greater than or equal to two. M photodetector circuits in each row are connected to a common reference potential line, M photodetector circuits in each row are connected to a common power line, and N photodetector circuits in each column are connected to a common photodetection line.

Advantageous Effects

In the photodetector circuit and the photodetector device according to the present disclosure, the potential difference between the gate and the source of the current output transistor can be set to a present threshold voltage of the current output transistor by storing the electric charges in the first capacitor.

With an initial state being the state where the potential difference between the gate and the source of the current output transistor is set to the present threshold voltage of the current output transistor, the electric charges generated by the internal photoelectric effect in the photodetector transistor in an off state can be stored in the gate node of the current output transistor.

Hence, even if the threshold voltage of the current output transistor varies, the circuit characteristics of the photodetector circuit and the photodetector device are less influenced by such a variation.

According to the present disclosure, it is possible to provide a photodetector circuit and a photodetector device which can reduce changes in circuit characteristics caused due to the changes in characteristics of the transistors, compared to a conventional technology.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENT (Circumstances Leading to an Aspect of the Present Disclosure)

The inventor has found the following problems in the conventional photodetector circuit and the conventional photodetector device.

Conventionally, a photodetector circuit is used, for example, in an input device, such as a light pen, for a display screen, and in an X-ray detector.

Figure 15:
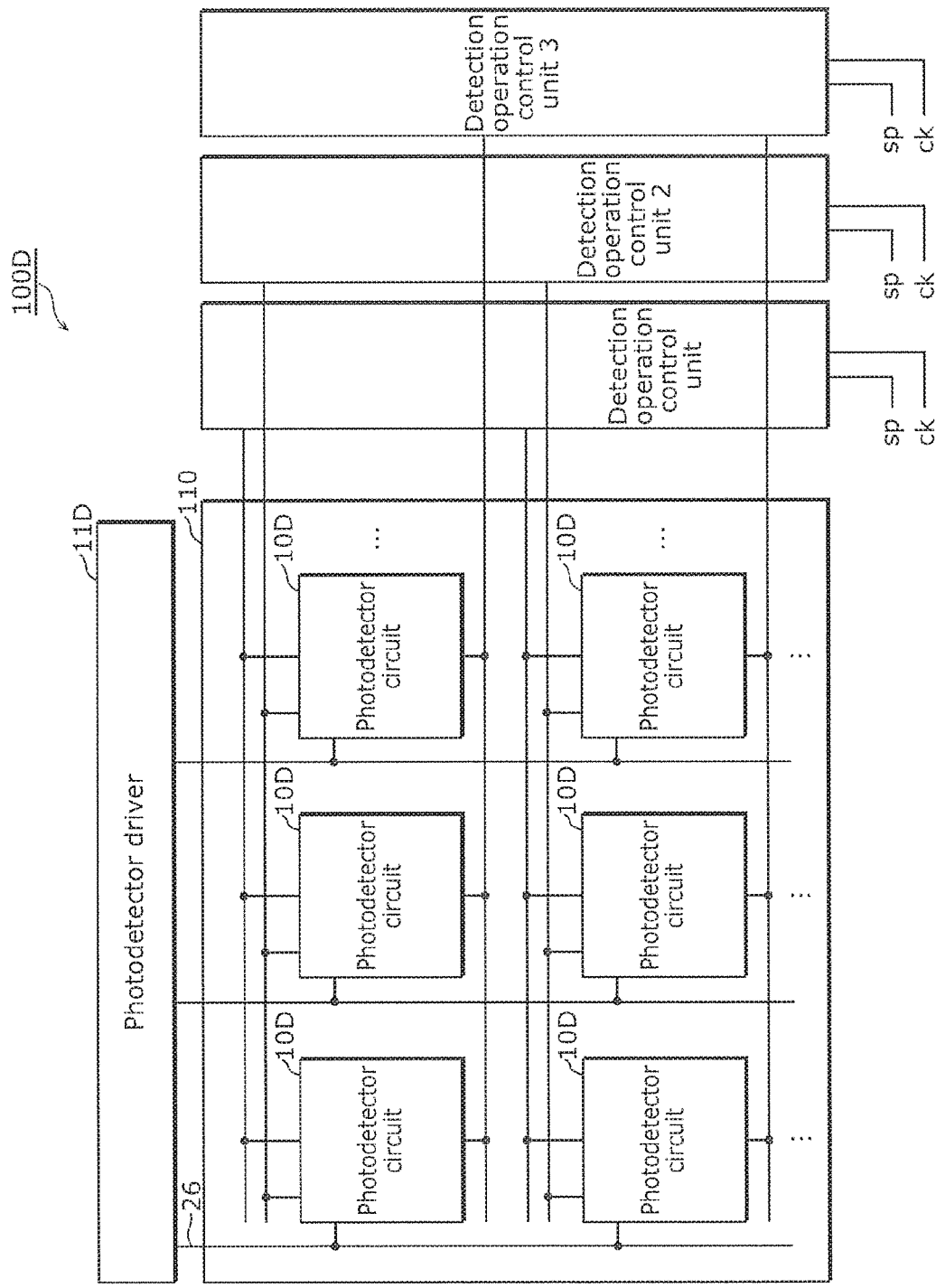
FIG. 15 is a block diagram illustrating a configuration of a conventional photodetector device.

FIG. 15 is a block diagram illustrating a configuration of a conventional photodetector device 100D.

Figure 16:
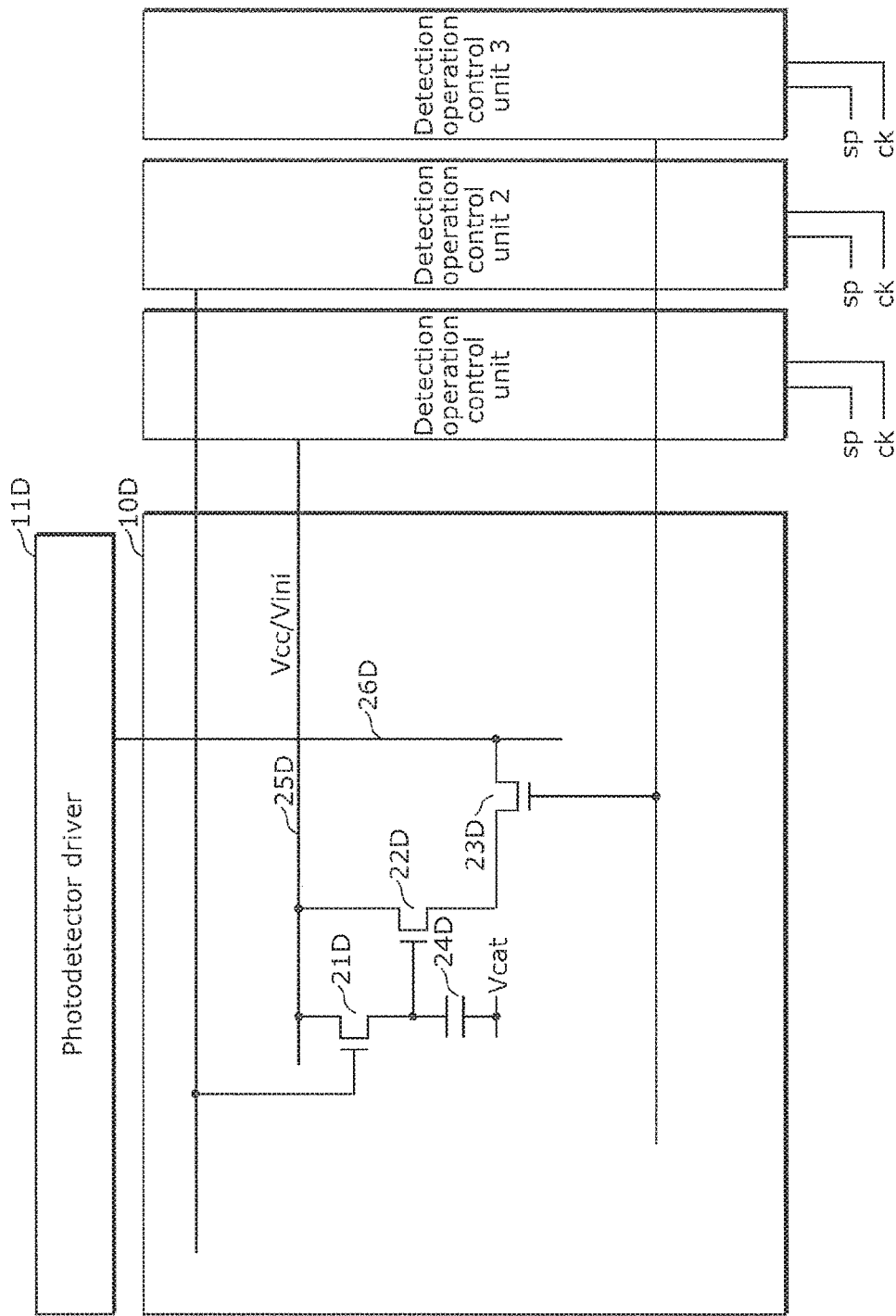
FIG. 16 is a block diagram illustrating a configuration of a conventional photodetector circuit.

FIG. 16 is a block diagram illustrating a configuration of a conventional photodetector circuit 10D.

Figure 17:
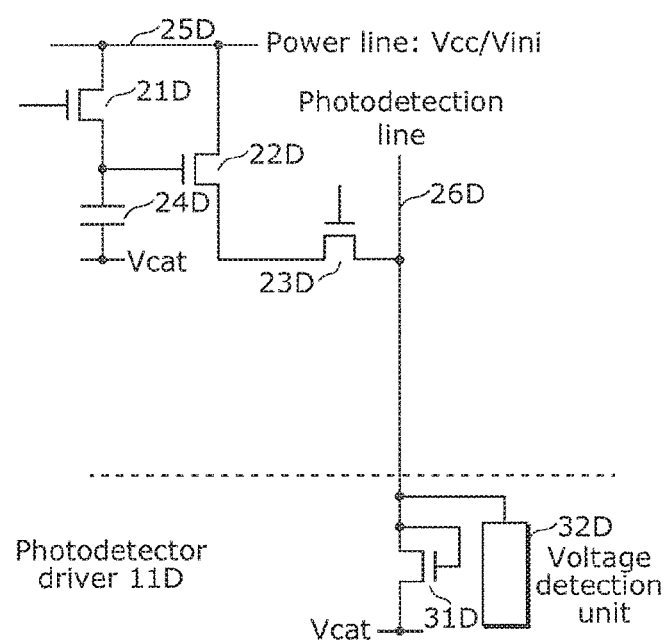
FIG. 17 is a block diagram illustrating a configuration of the conventional photodetector circuit and part of a peripheral circuit.

FIG. 17 is a block diagram illustrating a configuration of the conventional photodetector circuit 10D and part of a peripheral circuit.

As illustrated in FIG. 16, each conventional photodetector circuit 10D includes a photodetector transistor 21D, a current output transistor 22D, a switching transistor 23D, and a capacitor 24D.

The photodetector transistor 21D functions as a photoelectric conversion element in an off state. In other words, upon receiving light when the photodetector transistor 21D is in an off state, the source of the photodetector transistor 21D collects the electric charges generated by the internal photoelectric effect.

A power line 25D to which the drain of the current output transistor 22D is connected has the following two values: Vcc used in a photodetection period and a detected voltage output period to be described later (see FIG. 18); and Vini used in a detection preparation period to be described later (see FIG. 18).

Figure 18:
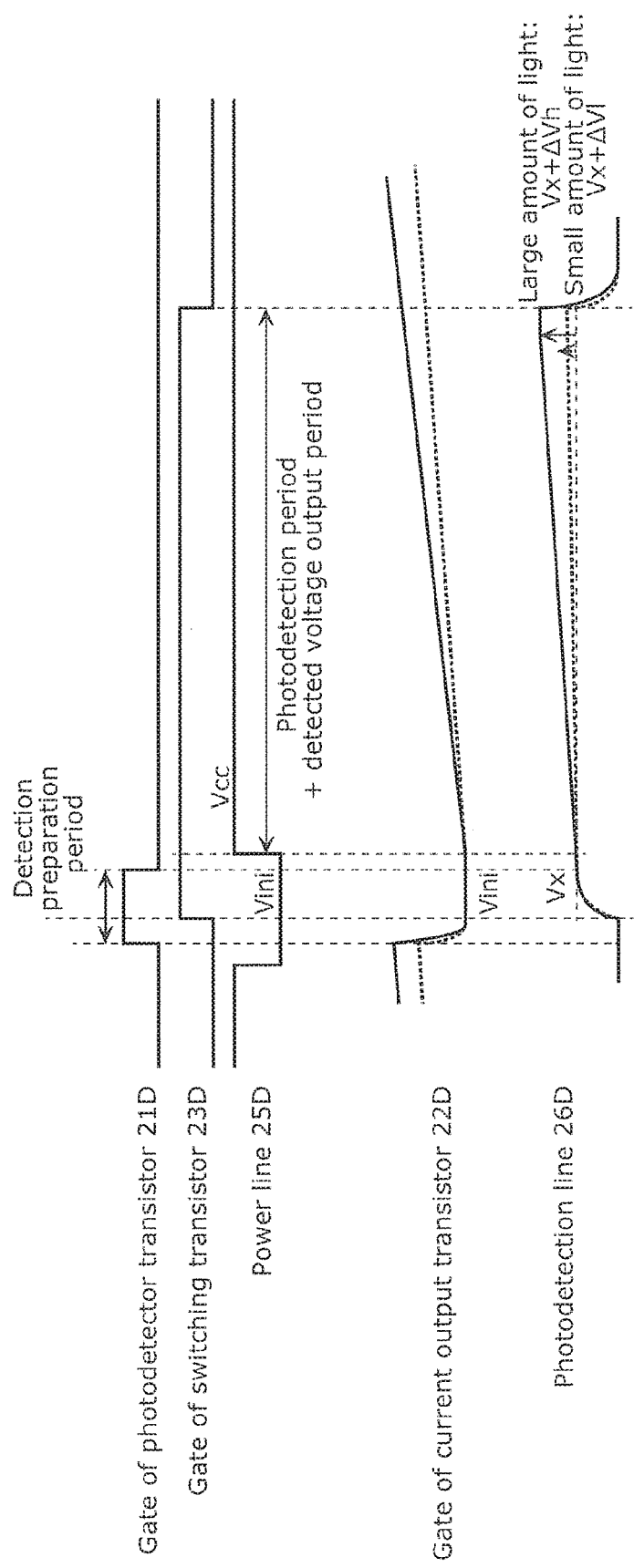
FIG. 18 is a timing chart illustrating an operation of the conventional photodetector device.

FIG. 18 is a timing chart illustrating an operation of the conventional photodetector device 100D.

Figure 19A:
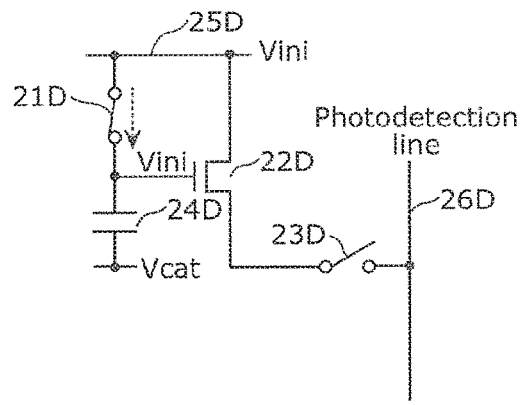
FIG. 19A is a schematic diagram 1 illustrating an operating state of the conventional photodetector device.
Figure 19B:
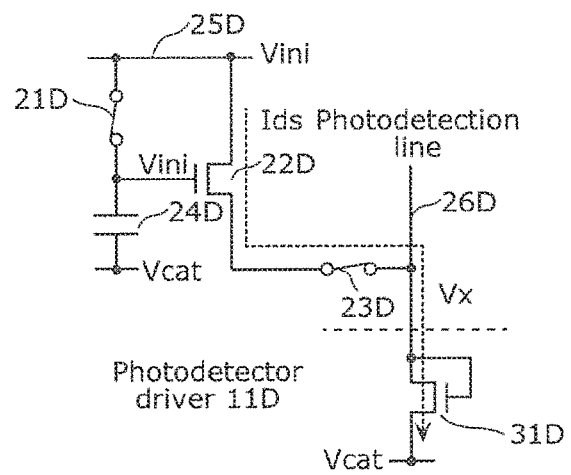
FIG. 19B is a diagram 2 illustrating an operating state of the conventional photodetector device.
Figure 19C:
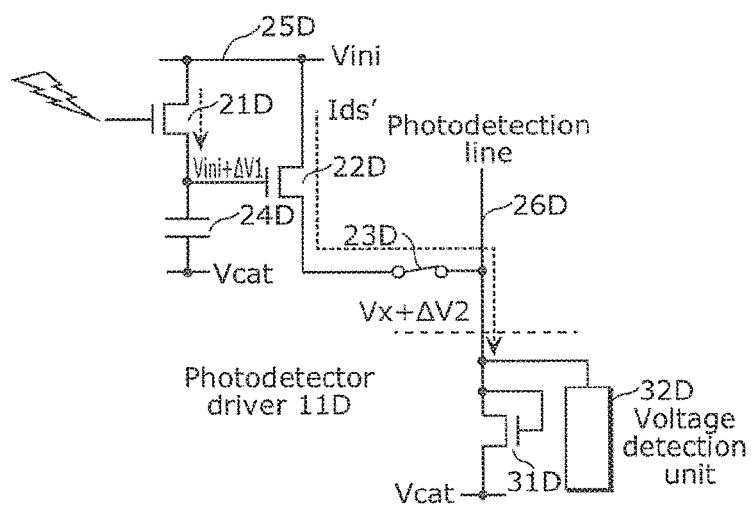
FIG. 19C is a diagram 3 illustrating an operating state of the conventional photodetector device.

FIG. 19A, FIG. 19B, and FIG. 19C are schematic diagrams illustrating the operating states of the conventional photodetector device 100D.

As illustrated in FIG. 18, in the conventional photodetector device 100D, first, the power line 25D is caused to have Vini to turn on the photodetector transistor 21D in the detection preparation period. When the photodetector transistor 21D is turned on, the gate potential of the current output transistor 22D becomes Vini (see FIG. 19A).

Next, the switching transistor 23D is turned on to connect the source of the current output transistor 22D to the photodetection line 26D. Here, the gate voltage and the drain voltage of the current output transistor 22D each are Vini. If voltage Vgs between the gate and the source of the current output transistor 22D is greater than threshold voltage Vth when the switching transistor 23D is turned on, the current output transistor 22D operates in saturation region. Furthermore, when the source voltage of the current output transistor 22D is greater than the sum of the threshold voltage of a diode 31D connected in a photodetector driver 11D and potential Vcat of the power supply connected to the source of the diode 31D, as illustrated in FIG. 19B, current Ids flows through the current output transistor 22D and the photodetection line 26D has potential Vx.

Here, the value of Vx reflects the variations in threshold voltage Vth of the current output transistor 22D. In other words, when Vth of the current output transistor 22D varies due to time degradation and the like, the value of Vx also varies.

After the potential of the photodetection line 26D becomes Vx, the photodetector transistor 21D is turned off.

In the photodetection period+the detected voltage output period after the photodetector transistor 21D is turned off, the power line 25D is caused to have Vcc. In the photodetection period+the detected voltage output period, the photodetector transistor 21D is in an off state. Hence, during the photodetection period+the detected voltage output period, the photodetector transistor 21D functions as a photoelectric conversion element. Furthermore, when Vcc is greater than Vini, the photodetector transistor 21D causes leak current to flow in the direction in which the gate voltage of the current output transistor 22D is increased, according to the amount of received light. When ΔV1 is the amount of variation in gate voltage of the current output transistor 22D and ΔV2 is the amount of variation in source voltage, current Ids' flows through the photodetection line 26D and voltage Vx+ΔV2 is output from the photodetection line 26D (see FIG. 19C).

When the photodetection period+the detected voltage output period end, the switching transistor 23D is turned off.

Here, the leak current of the photodetector transistor 21D varies according to the amount of received light. In other words, when the amount of light received by the photodetector transistor 21D increases, the amount of increase in gate voltage of the current output transistor 22D in the photodetection period+the detected voltage output period also increases. In contrast, when the amount of light received by the photodetector transistor 21D decreases, the amount of increase in gate voltage of the current output transistor 22D in the photodetection period+the detected voltage output period decreases. Accordingly, as illustrated in FIG. 18, the voltage detection unit 32D detects values Vx+ΔVh or Vx+ΔVl which correspond to the amount of light received by the photodetector transistor 21D.

Voltage Vx+V2 detected by the voltage detection unit 32D includes Vx which reflects the variations in threshold voltage Vth of the current output transistor 22D. Hence, the amount of light received by the photodetector transistor 21D cannot be correctly calculated simply from the absolute value of Vx+V2.

Accordingly, when the conventional photodetector device 100D is used, it is necessary to detect Vx separately and calculate (Vx+V2)−Vx in order to correctly calculate the amount of light received by the photodetector transistor 21D.

In view of such problems, the inventor has arrived at the photodetector circuit and the photodetector device according to the present disclosure.

Hereinafter, an embodiment of the present disclosure will be described in details with reference to the drawings. Note that the embodiment described below shows a specific example of the present disclosure. The numerical values, shapes, materials, structural elements, the arrangement and connection of the structural elements, timing of signals, etc., described in the following embodiment are mere examples, and are therefore not intended to limit the present disclosure. Among the structural elements in the following embodiment, structural elements not recited in any one of the independent claims which indicate the broadest inventive concepts will be described as arbitrary structural elements. Note that each drawing is a schematic illustration and not necessarily a precise illustration. Essentially the same structural elements are given the same reference signs in the figures, and overlapping descriptions thereof will be omitted or simplified.

EMBODIMENT

Figure 1:
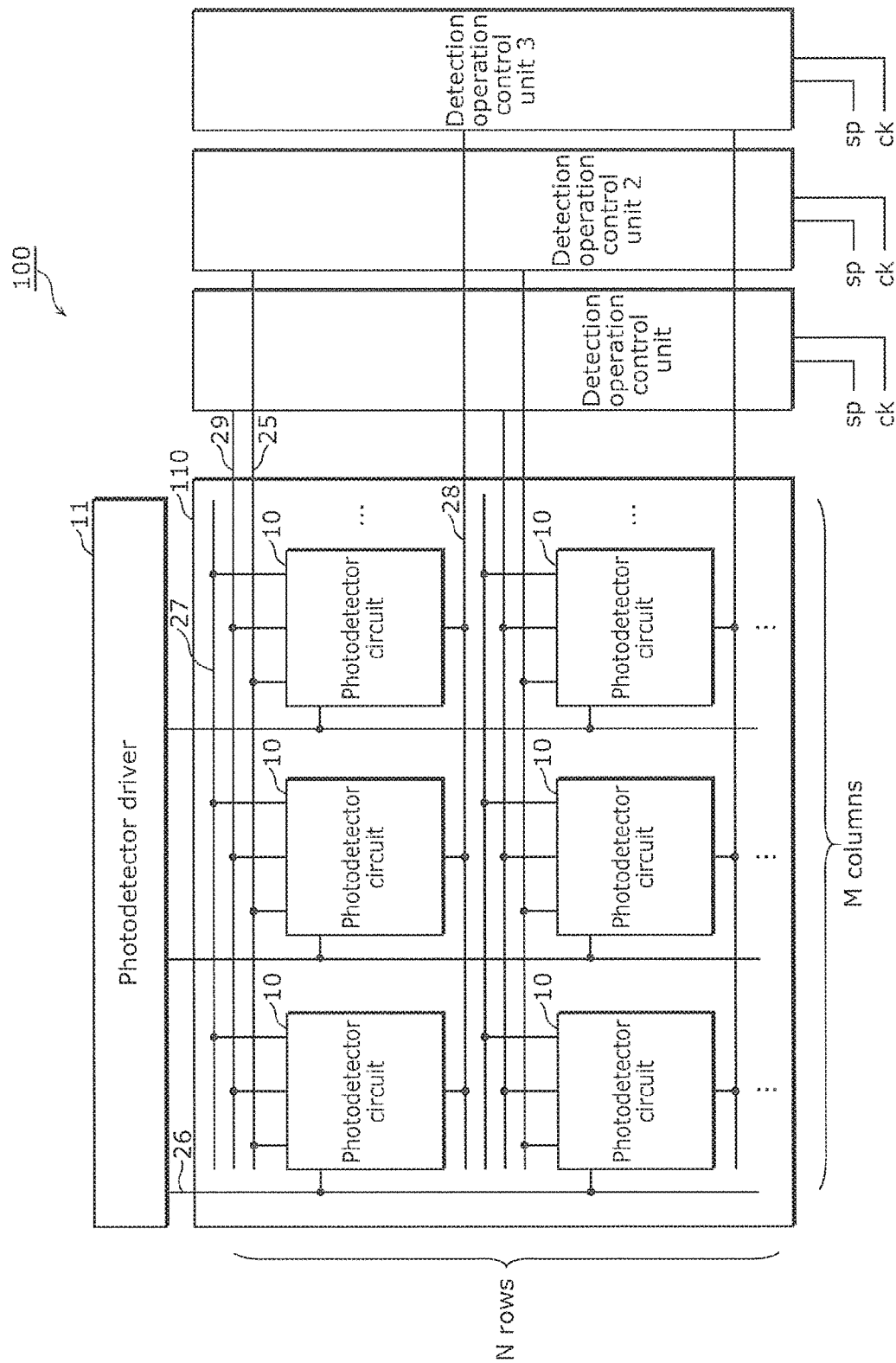
FIG. 1 is a block diagram illustrating a configuration of a photodetector device according to an embodiment.

FIG. 1 is a block diagram illustrating a configuration of a photodetector device 100 according to an embodiment.

As illustrated in FIG. 1, the photodetector device 100 includes a photodetector circuit array 110 including a plurality of photodetector circuits 10 two-dimensionally arrayed in N rows and M columns where N is an integer greater than or equal to two and M is an integer greater than or equal to two.

Figure 2:
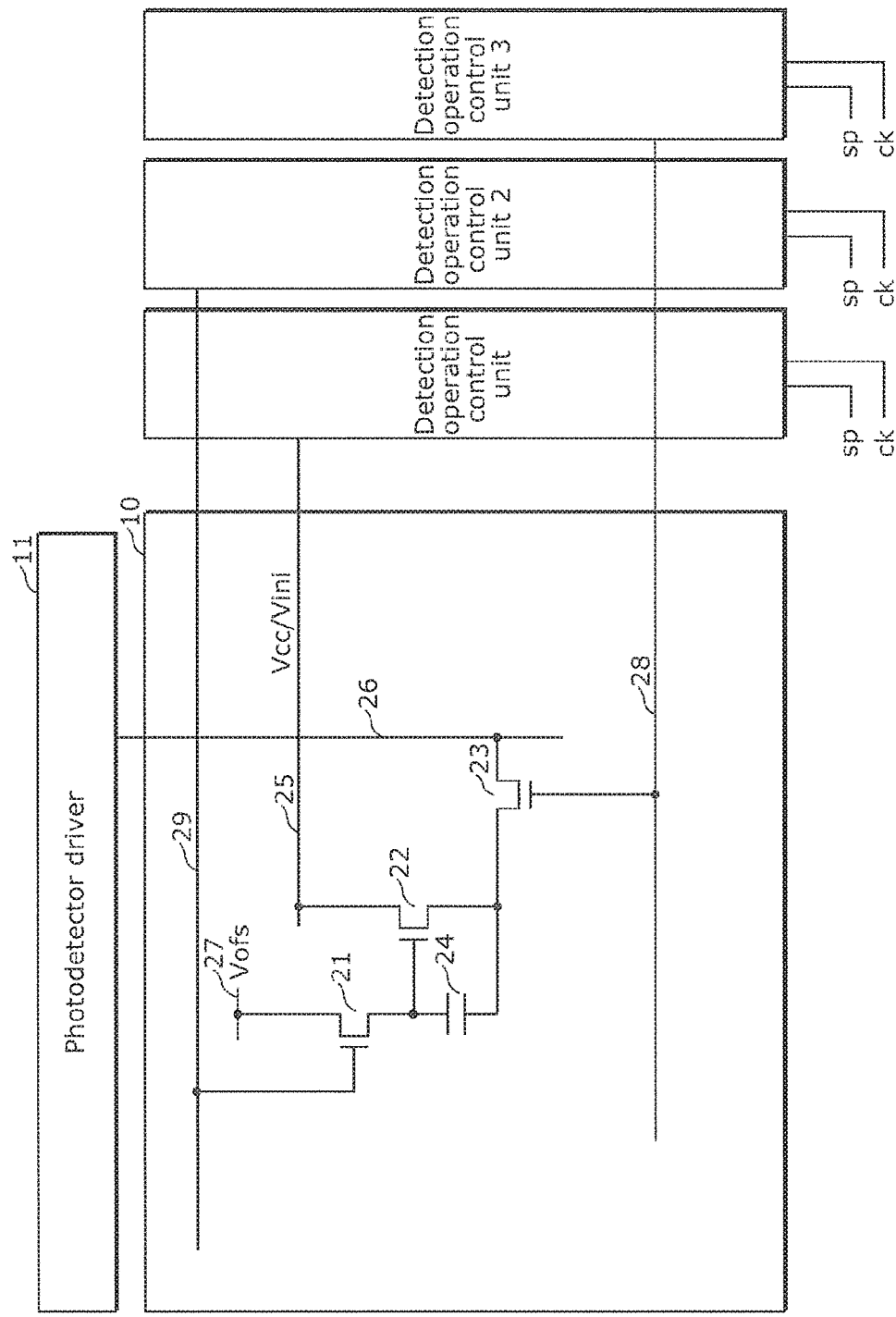
FIG. 2 is a block diagram illustrating a configuration of a photodetector circuit according to the embodiment.

FIG. 2 is a block diagram illustrating a configuration of a photodetector circuit 10 according to the embodiment.

Figure 3:
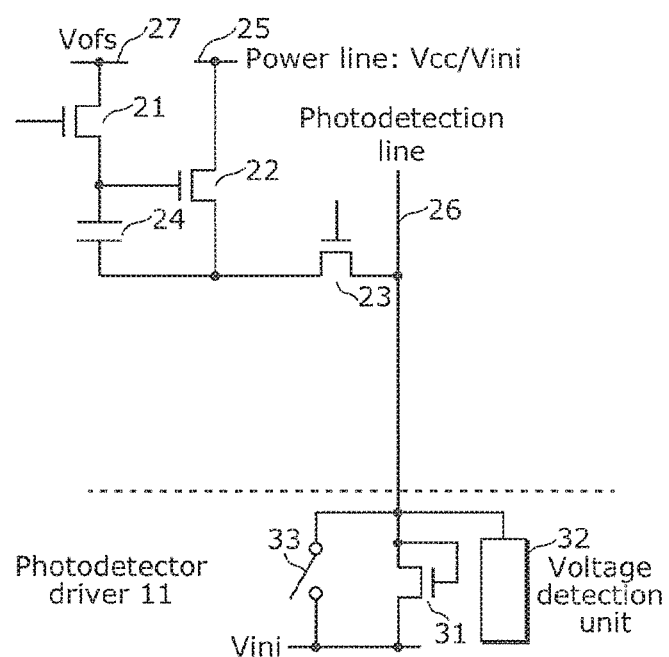
FIG. 3 is a block diagram illustrating a configuration of a photodetector circuit and part of a peripheral circuit according to the embodiment.

FIG. 3 is a block diagram illustrating a configuration of the photodetector circuit 10 and part of a peripheral circuit.

As illustrated in FIG. 2, each photodetector circuit 10 includes a photodetector transistor 21, a current output transistor 22, a switching transistor 23, and a first capacitor 24.

In the photodetector circuit 10, the source of the photodetector transistor 21, the gate of the current output transistor 22, and a first terminal of the first capacitor 24 are connected to one another, and the source of the current output transistor 22, the drain of the switching transistor 23, and a second terminal of the first capacitor 24 are connected to one another.

The photodetector transistor 21 has a drain connected to a reference potential line 27, and functions as a photoelectric conversion element in an off state. In other words, upon receiving light when the photodetector transistor 21 is in an off state, the source of the photodetector transistor 21 collects the electric charges generated by the internal photoelectric effect.

The current output transistor 22 has a drain connected to a power line 25 which can have first power supply potential Vcc and a second power supply potential Vini.

The switching transistor 23 has a source connected to a photodetection line 26.

Furthermore, as illustrated in FIG. 1, in the photodetector circuit array 110, M photodetector circuits 10 in each row are connected to a common reference potential line 27. M photodetector circuits 10 in each row are connected to a common power line 25. N photodetector circuits 10 in each column are connected to a common photodetection line 26.

In this embodiment, the potential of each reference potential line 27 is fixed to Vofs (for example, 5V).

Figure 4:
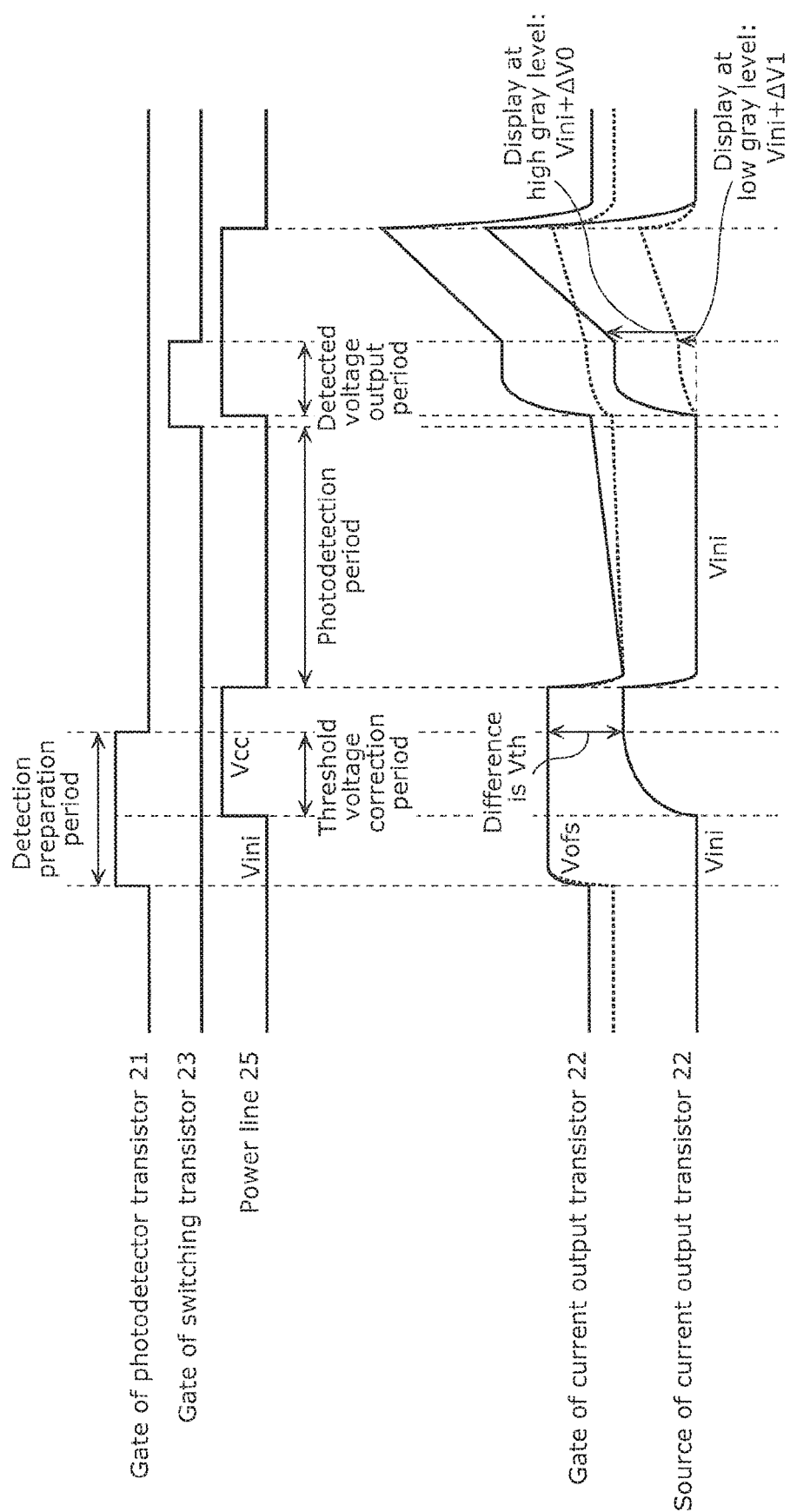
FIG. 4 is a timing chart illustrating an operation of the photodetector device according to the embodiment.

FIG. 4 is a timing chart illustrating an operation of the photodetector device 100.

FIG. 5A, FIG. 5B, FIG. 5C, FIG. 5D, and FIG. 5E are schematic diagrams illustrating the operating states of the photodetector device 100.

As illustrated in FIG. 4, in the photodetector device 100, the potential of the power line 25 at a time immediately before a detection preparation period is Vini (for example, 0V). Subsequently, in the detection preparation period, the photodetector transistor 21 is turned on. Here, the difference between potential Vofs of the reference potential line 27 provided to the gate of the current output transistor 22 and potential Vini of the power line 25 provided to the drain of the current output transistor 22 is required to be set to be greater than threshold voltage Vth of the current output transistor 22 (see FIG. 5A).

Figure 5A:
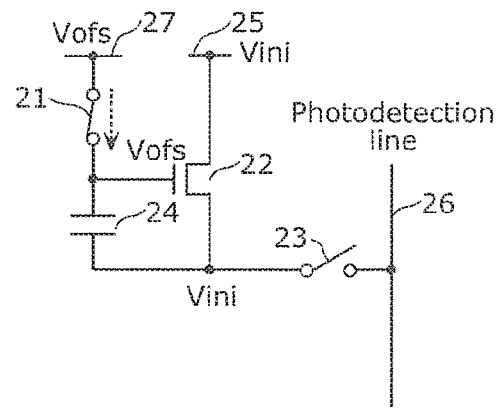
FIG. 5A is a schematic diagram 1 illustrating an operating state of the photodetector device according to the embodiment.
Figure 5B:
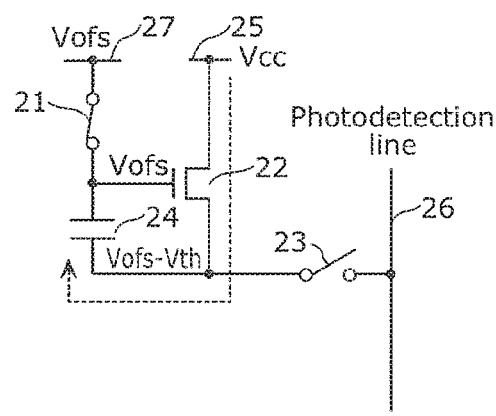
FIG. 5B is a schematic diagram 2 illustrating an operating state of the photodetector device according to the embodiment.

Next, in a threshold voltage correction period, the potential of the power line 25 is changed from Vini to Vcc (for example, 10V). Here, Vcc is a potential at which the current output transistor 22 can operate in saturation region. Here, as illustrated in FIG. 5B, current corresponding to the voltage between the gate and the source of the current output transistor 22 flows through the current output transistor 22 from the power line 25. Accordingly, the source potential of the current output transistor 22 increases from Vini, and after a predetermined time, the voltage between the gate and the source of the current output transistor 22 becomes threshold voltage Vth of the current output transistor 22. The voltage between the gate and the source is stored in the first capacitor 24.

Subsequently, the photodetector transistor 21 is turned off.

Figure 5C:
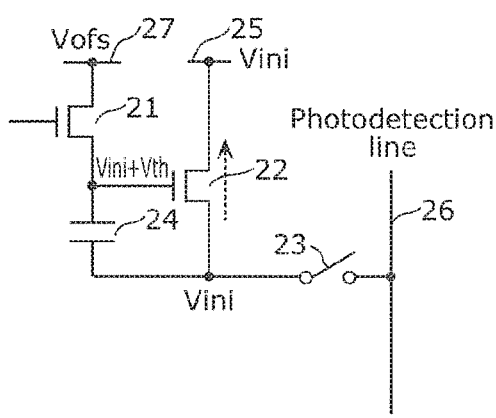
FIG. 5C is a schematic diagram 3 illustrating an operating state of the photodetector device according to the embodiment.
Figure 5D:
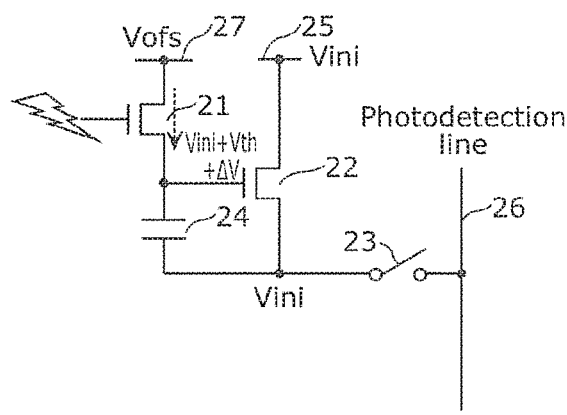
FIG. 5D is a schematic diagram 4 illustrating an operating state of the photodetector device according to the embodiment.

Next, in a photodetection period, the potential of the power line 25 is changed from Vcc to Vini again (see FIG. 5C). Here, although the potential of the source of the current output transistor 22 becomes Vini again, the first capacitor 24 maintains the potential difference between the gate and the source of the current output transistor 22 to threshold voltage Vth of the current output transistor 22. Accordingly, the gate potential of the current output transistor 22 becomes Vini+Vth. Here, the photodetector transistor 21 is in an off state, and functions as the photoelectric conversion element as described above. Hence, the photodetector transistor 21 causes leak current to flow in the direction in which the gate potential of the current output transistor 22 is increased, according to the amount of received light (see FIG. 5D). When ΔV is the variation amount of the gate potential of the current output transistor 22 at this time, the gate potential of the current output transistor 22 after a predetermined period becomes a value of Vini+Vth+ΔV.

Figure 5E:
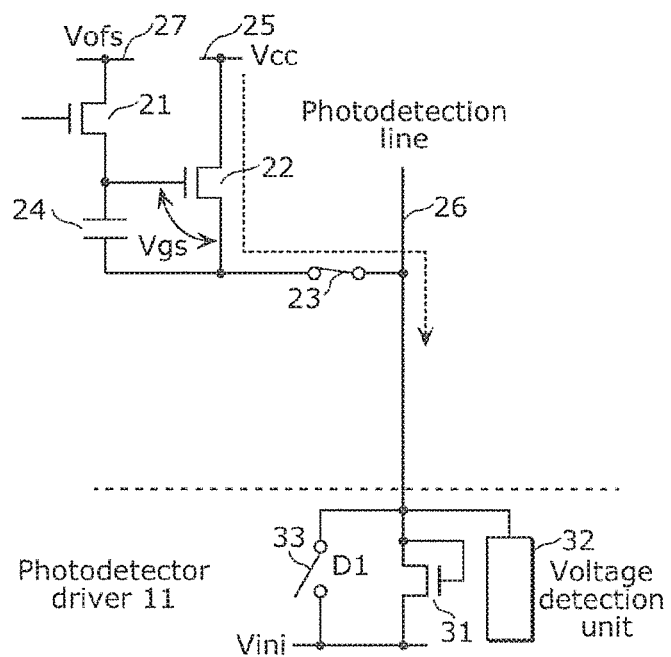
FIG. 5E is a schematic diagram 5 illustrating an operating state of the photodetector device according to the embodiment.

After the switching transistor 23 is turned on, the potential of the power line 25 is changed from Vini to Vcc in a detected voltage output period. Here, before the switching transistor 23 is turned on, it may be that the potential of the photodetection line 26 is set to the same as potential Vini of the power line 25 in advance by, for example, a switch 33 of the photodetector driver 11. Here, as illustrated in FIG. 5E, current flows according to voltage Vgs between the gate and the source of the current output transistor 22. Voltage Vgs between the gate and the source of the current output transistor 22 varies according to the leak current from the photodetector transistor 21 in the photodetection period, and thus, the voltage detected by the voltage detection unit 32 is a value corresponding to the amount of light received by the photodetector transistor 21 in the photodetection period.

After the detected voltage output period ends, the switching transistor 23 is turned off, causing the power line 25 to have potential Vini.

<Observation>

As described above, the photodetector circuit 10 performs, in the detection preparation period, threshold voltage correction in which the voltage between the gate and the source of the current output transistor 22 is set to threshold voltage Vth of the current output transistor 22. Accordingly, the voltage detected by the voltage detection unit 32 of the photodetection driver 11 is a voltage in which the variation in threshold voltage characteristics of the current output transistor 22 is corrected.

Accordingly, even when the threshold voltage of the current output transistor 22 varies, the photodetector device 100 is capable of reducing the effects of the variation on the circuit characteristics of the photodetector circuit 10 and the photodetector device 100.

As a result, in the photodetector device 100, the potential corresponding to Vx is not required to be detected, unlike the conventional photodetector device 100D.

Furthermore, in the photodetector circuit 10, the current output transistor 22 is not required to be turned on in the photodetection period, unlike the photodetector circuit 10D.

Accordingly, compared to the conventional photodetector device 100D, the photodetector device 100 is capable of reducing the occupation period of each photodetector circuit 10 in one photodetection line 26 to which M photodetector circuits 10 are connected.

As a result, the photodetector device 100 is capable of making the cycle of the voltage detection performed by the voltage detection unit 32 shorter than that of the conventional photodetector device 100D.

(Variation 1)

Now, a photodetector device according to Variation 1, in which part of the functions of the photodetector device 100 according to the above embodiment is changed, will be described with reference to the drawings.

The photodetector device 100 according to the above embodiment is an example of a configuration where the potential of each reference potential line 27 is fixed to Vofs. In contrast, the photodetector device according to Variation 1 is an example of a configuration where the potential of each reference potential line 27 is selectively fixed to Vofs (first reference potential) or Vofs2 (second reference potential).

Hereinafter, the photodetector device according to Variation 1 will be described, manly focusing on the changes from the photodetector device 100 according to the above embodiment.

Figure 6:
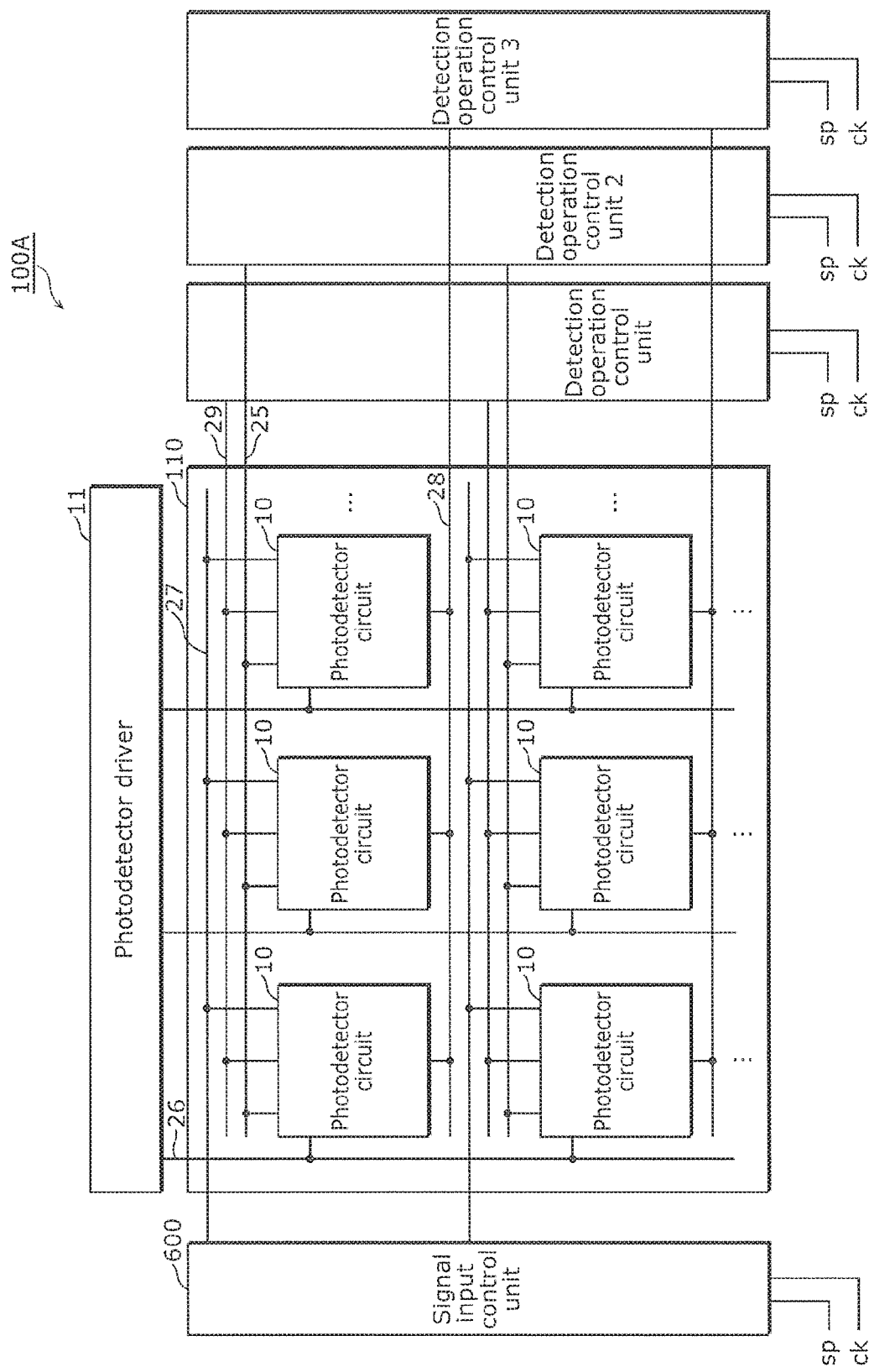
FIG. 6 is a block diagram illustrating a configuration of photodetector device according to Variation 1.

FIG. 6 is a block diagram illustrating a configuration of a photodetector device 100A according to Variation 1.

As illustrated in FIG. 6, the photodetector device 100A is different from the photodetector device 100 according to the above embodiment in that a signal input control unit 600 is added. The signal input control unit 600 selectively fixes, for each row, the potential of the reference potential line 27 to Vofs or Vofs2 (for example, 10V) that is greater than Vofs.

Figure 7:
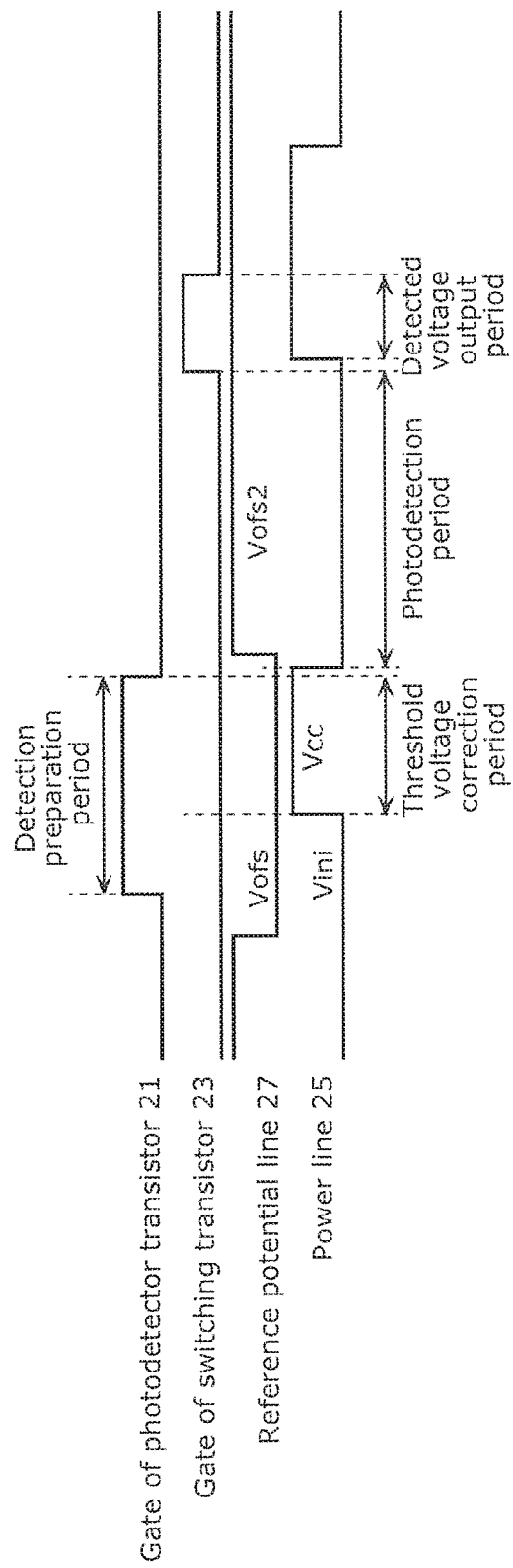
FIG. 7 is a timing chart illustrating an operation of the photodetector device according to Variation 1.

FIG. 7 is a timing chart illustrating an operation of the photodetector device 100A.

As illustrated in FIG. 7, in the photodetector device 100A, the potential of the reference potential line 27 is increased from Vofs to Vofs2 in the photodetection period.

<Observation>

In the photodetector device 100 according to the above embodiment, when the gate potential of the current output transistor 22 (that is, the source potential of the photodetector transistor 21) reaches Vofs in the photodetection period, no more leak current flows through the photodetector transistor 21. Hence, the amount of electric charges that can be stored in the gate node of the current output transistor 22 is saturated when the gate potential of the current output transistor 22 reaches Vofs.

In contrast, in the photodetector device 100A, even when the gate potential of the current output transistor 22 (that is, the source potential of the photodetector transistor 21) reaches Vofs in the photodetection period, it is possible to cause the leak current to flow through the photodetector transistor 21 till the gate potential of the current output transistor 22 reaches Vofs2. Hence, in the photodetector device 100A, the saturation amount of the electric charges stored in the gate node of the current output transistor 22 can he increased compared to the photodetector device 100 according to the above embodiment.

(Variation 2)

Now, a photodetector device according to Variation 2, in which part of the functions of the photodetector device 100A according to Variation 1 is changed, will be described with reference to the drawings.

The photodetector device 100A according to Variation 1 is an example of a configuration where each photodetector circuit 10 includes the first capacitor 24 between the gate and the source of the current output transistor 22. In contrast, the photodetector device according to Variation 2 is an example of a configuration where each photodetector circuit includes a second capacitor between the source of the current output transistor 22 and a fixed power supply Vcat (for example, ground), in addition to the first capacitor.

Hereinafter, the photodetector device according to Variation 2 will be described, manly focusing on the changes from the photodetector device 100A according to Variation 1.

Figure 8:
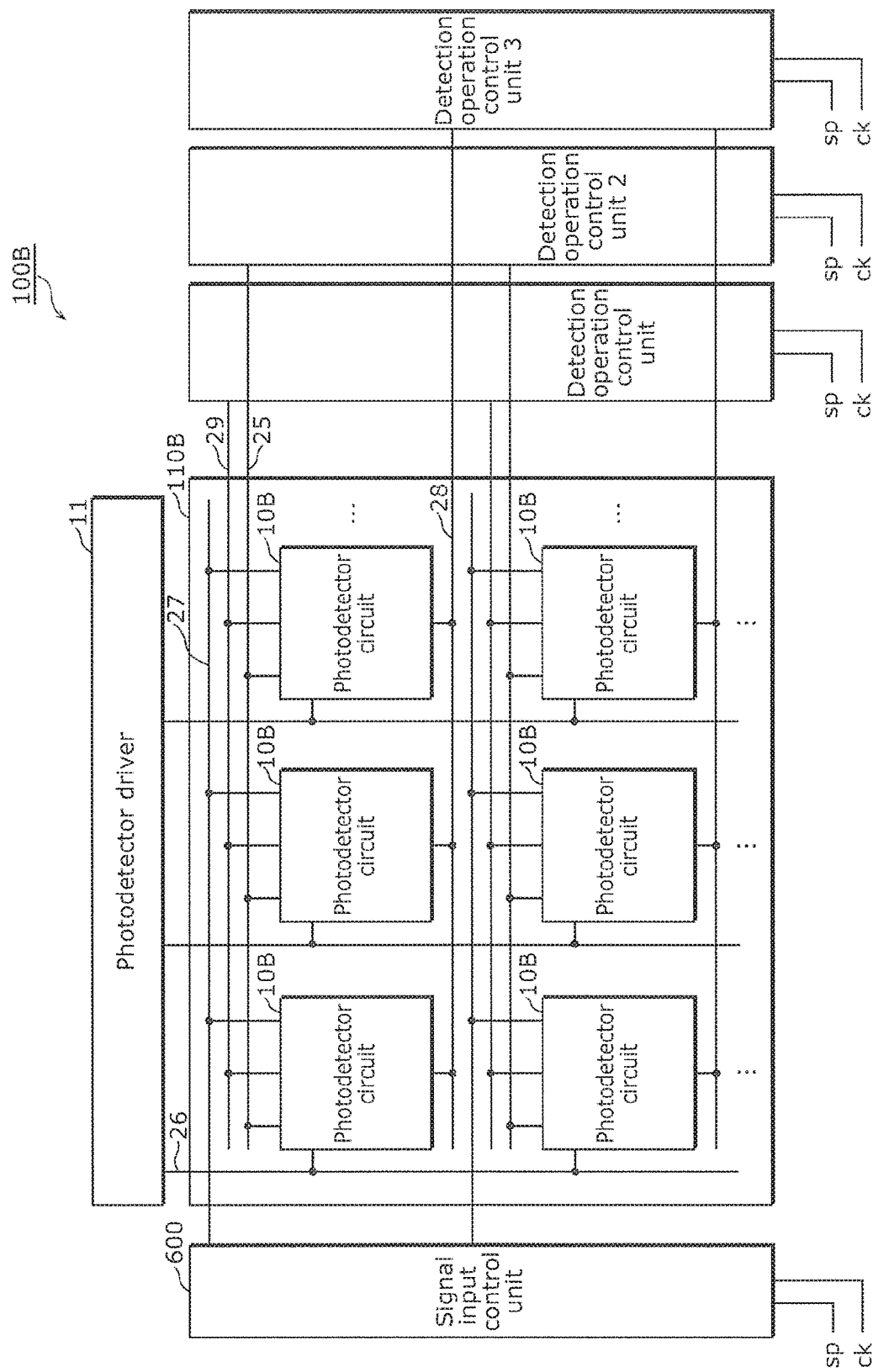
FIG. 8 is a block diagram illustrating a configuration of a photodetector device according to Variation 2.

FIG. 8 is a block diagram illustrating a configuration of a photodetector device 100B according to Variation 2.

As illustrated in FIG. 8, the photodetector device 100B is different from the photodetector device 100A according to Variation 1 in that the photodetector circuits 10 are changed to photodetector circuits 10B.

Figure 9:
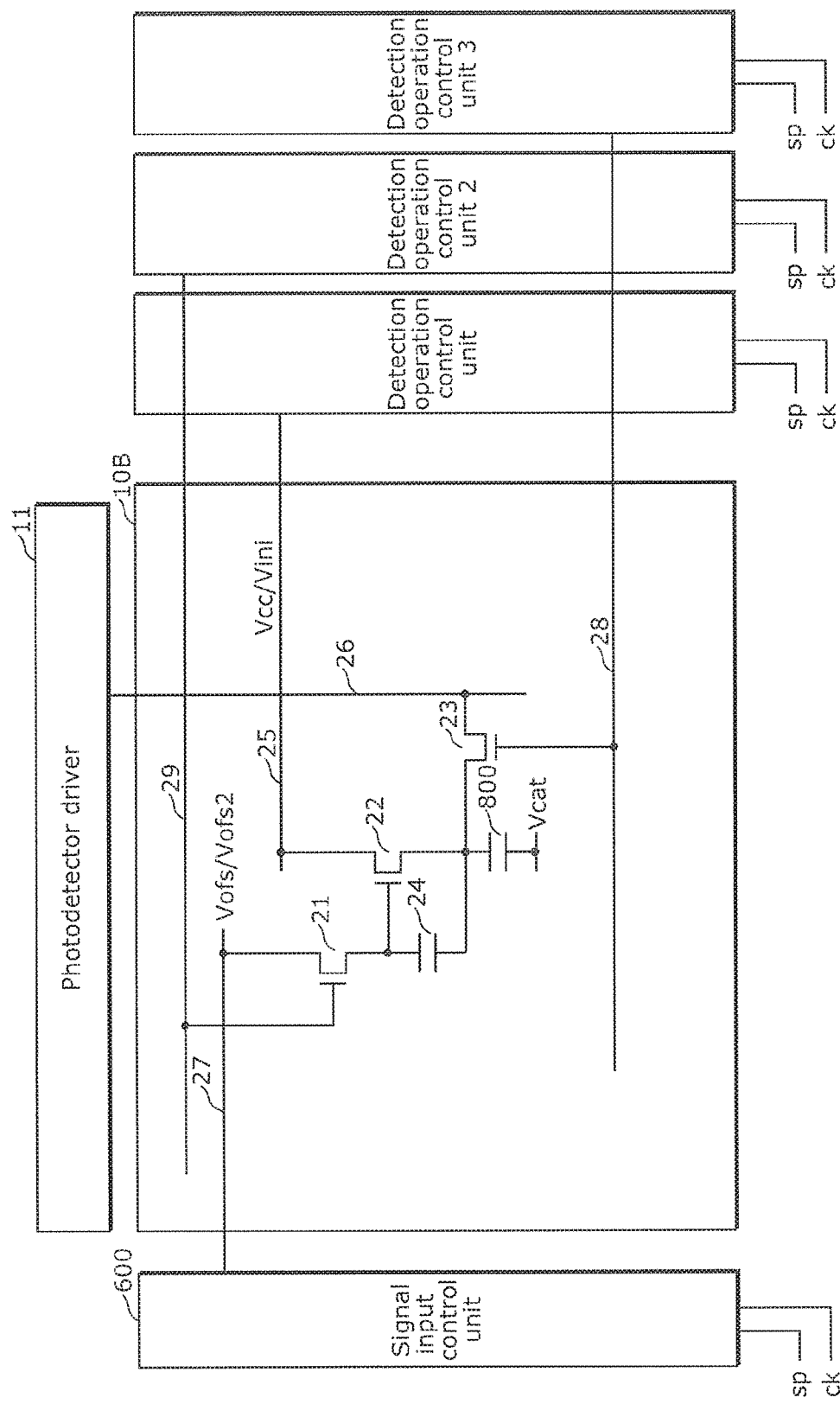
FIG. 9 is a block diagram illustrating a configuration of a photodetector circuit according to Variation 2.

FIG. 9 is a block diagram illustrating a configuration of a photodetector circuit 10B.

Figure 10:
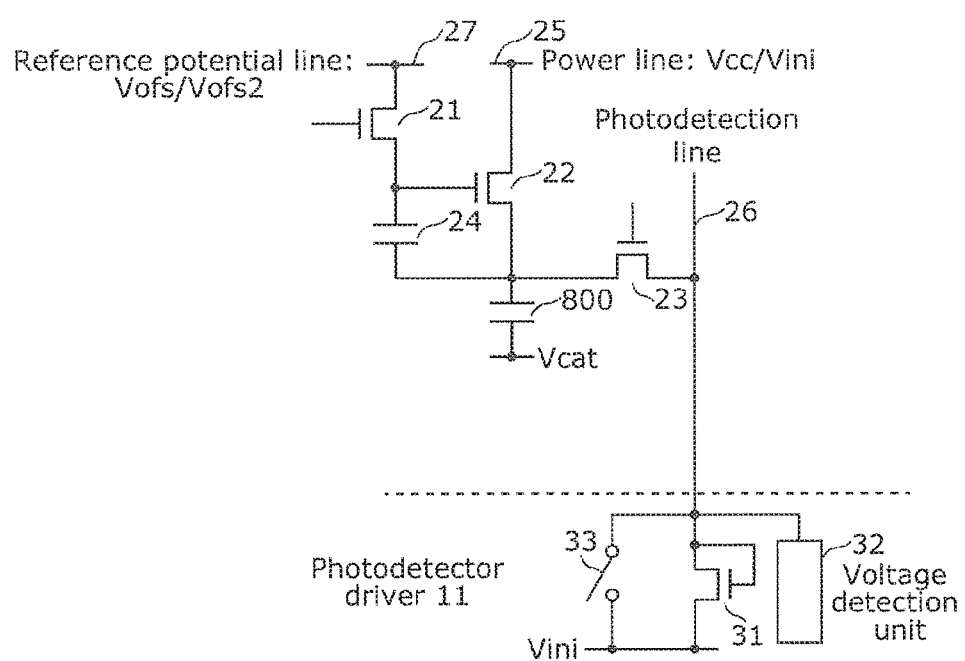
FIG. 10 is block diagram illustrating a configuration of the photodetector circuit and part of a peripheral circuit according to Variation 2.

FIG. 10 is a block diagram illustrating a configuration of the photodetector circuit 10B and part of a peripheral circuit.

As illustrated in FIG. 9, each photodetector circuit 10B includes a second capacitor 800 between the source of the current output transistor 22 and the fixed power supply Vcat in addition to the elements of the photodetector circuit 10 according to Variation 1.

Figure 11:
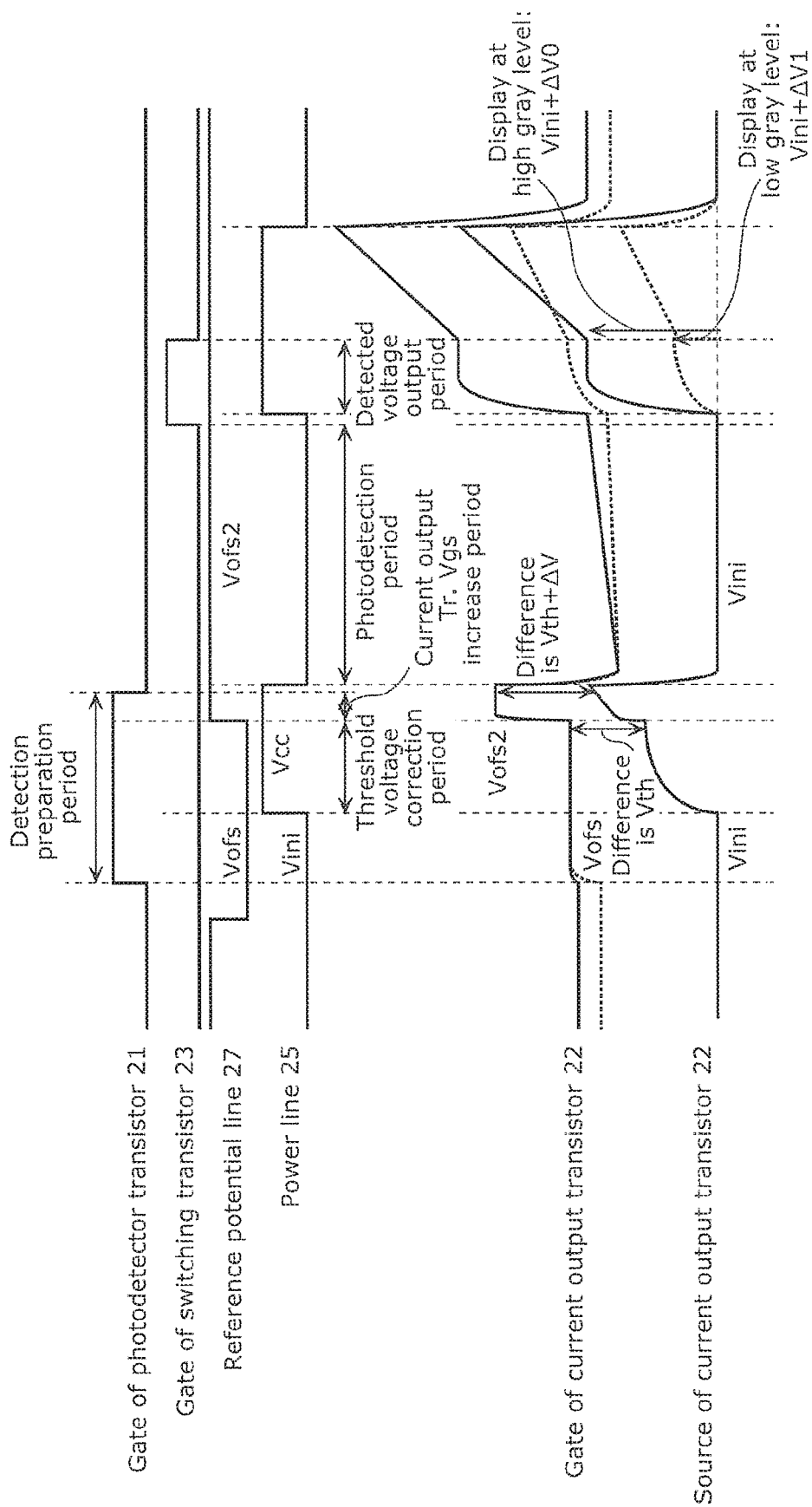
FIG. 11 is a timing chart illustrating an operation of the photodetector device according to Variation 2.

FIG. 11 is a timing chart illustrating an operation of the photodetector device 100B.

As illustrated in FIG. 11, in a current output Tr, Vgs increase period in the detection preparation period, the potential of the reference potential line 27 is increased from Vofs to Vofs 2 while the photodetector transistor 21 is on, This increases the gate potential of the current output transistor 22 to Vofs2. On the other hand, the source potential of the current output transistor 22 does not immediately increase to Vofs2-Vth because the second capacitor 800 is additionally included. Accordingly, as illustrated in FIG. 11, at the end of the current output Tr. Vgs increase period, voltage Vgs between the gate and the source of the current output transistor 22 can be set to Vth+ΔV (ΔV>0).

<Observation>

In the photodetector device 100A according to Variation 1, at the beginning of the photodetection period, the voltage between the gate and the source of the current output transistor 22 is Vth. In contrast, in the photodetector device 100B according to Variation 2, at the beginning of the photodetection period, the voltage between the gate and the source of the current output transistor 22 is Vth+ΔV (ΔV>0).

Hence, in the photodetector device 100B, the amount of current which flows through the current output transistor 22 in the detected voltage output period is greater than that of the photodetector device 100A according to Variation 1.

Accordingly, in the photodetector device 100B, the photodetector transistor 21 is capable of detecting the amount of light received in the photodetection period more precisely than the photodetector device 100A according to Variation 1 does.

Figure 12:
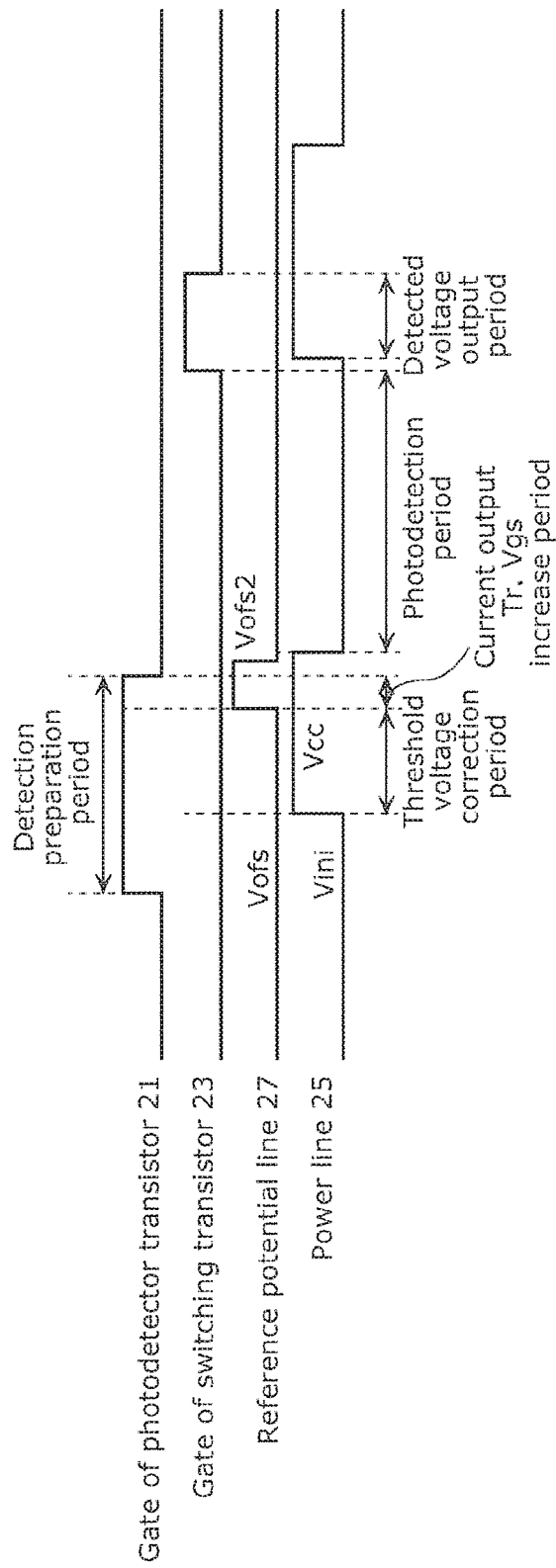
FIG. 12 is a timing chart illustrating an operation of the photodetector device according to Variation 2.

In Variation 2, as illustrated in FIG. 11, the potential of the reference potential line 27 in the photodetector device 100B is Vofs2 after the photodetection period. However, for example, as illustrated in FIG. 12, it may be that the potential of the reference potential line 27 becomes Vofs before the start of the photodetection period, and the Vofs is maintained at least till the end of the photodetection period.

(Variation 3)

Now, a photodetector device according to Variation 3, in which part of the functions of the photodetector device 100B according to Variation 2 is changed, will be described with reference to the drawings.

The photodetector device 1006 according to Variation 2 is an example of a configuration where the potential of the reference potential line 27 is selectively fixed to Vofs or Vofs2 for each row. In contrast, the photodetector device according to Variation 3 is an example of a configuration where the potential of the reference potential line 27 is selectively fixed to Vofs or Vofs2 commonly to all the rows.

Hereinafter, the photodetector device according to Variation 3 will be described, mainly focusing on the changes from the photodetector device 100B according to Variation 2.

Figure 13:
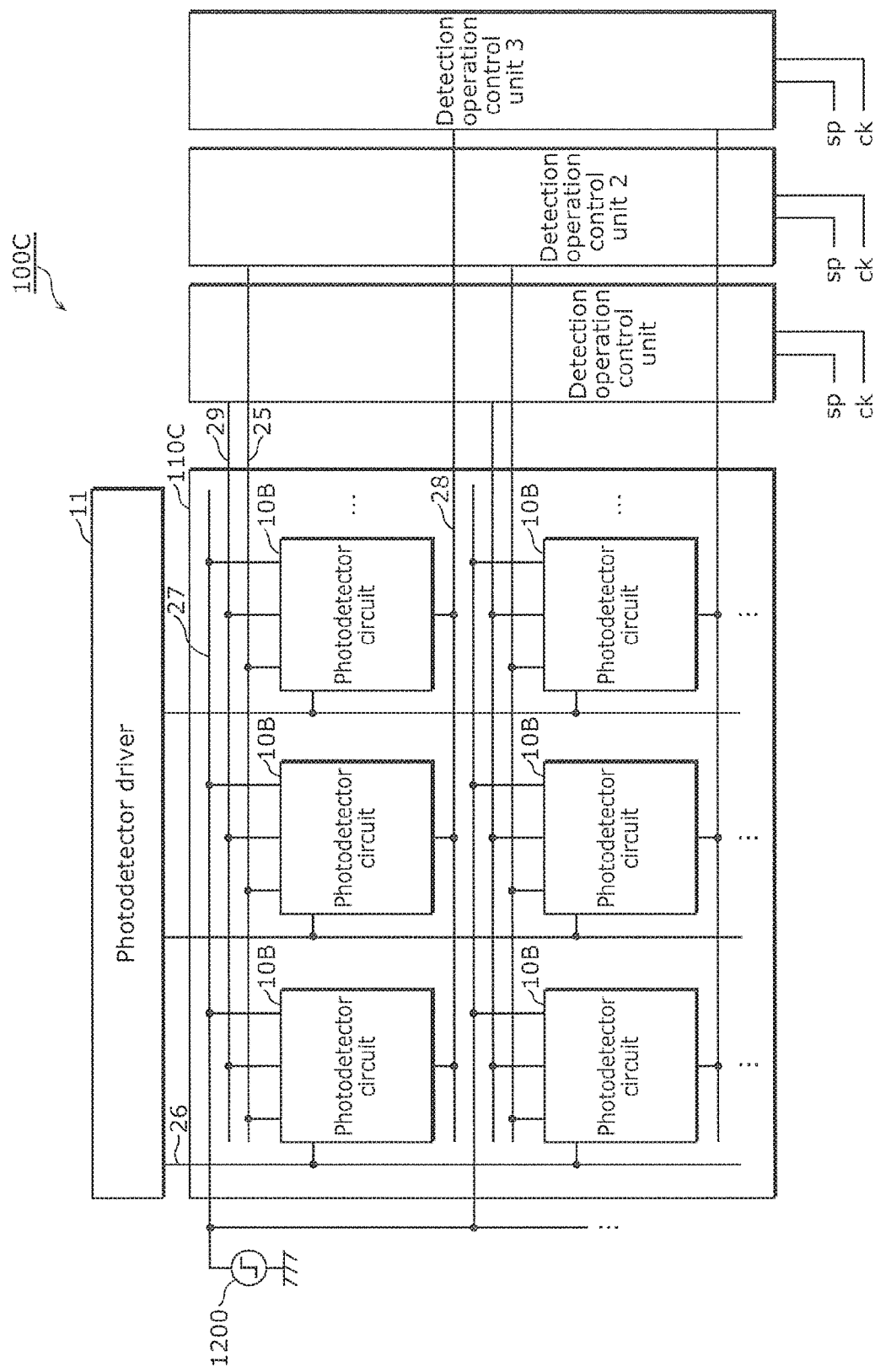
FIG. 13 is a block diagram illustrating a configuration of a photodetector device according to Variation 3.

FIG. 13 is a block diagram illustrating a configuration of a photodetector device 100C according to Variation 3.

As illustrated in FIG. 13, the photodetector device 100C is different from the photodetector device 1006 according to Variation 2 in that the signal input control unit 600 is changed to a signal input control unit 1300.

The signal input control unit 600 according to Variation 2 is a circuit which selectively fixes the potential of the reference potential line 27 to Vofs or Vofs2 for each row. In contrast, the signal input control unit 1300 is a pulse generating circuit (reference potential line drive circuit) which selectively fixes the potential of the reference potential line 27 to Vofs or Vofs2 commonly to all the rows.

Figure 14:
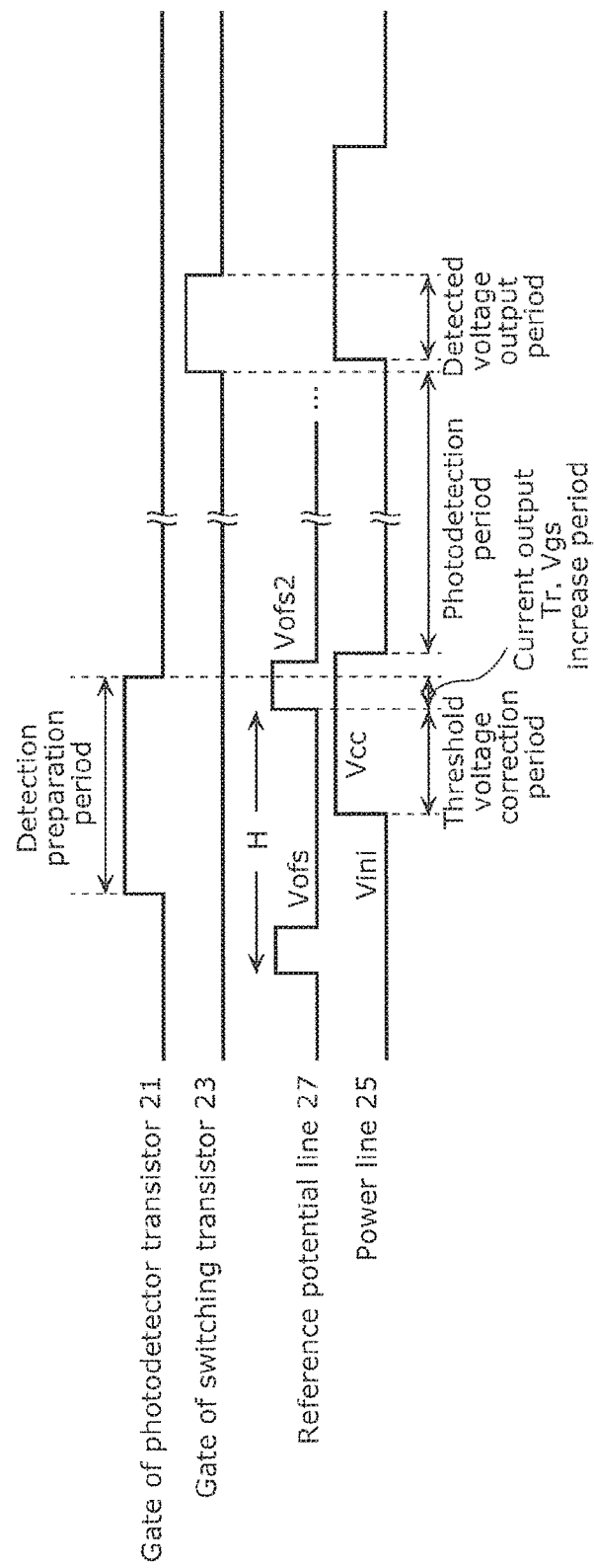
FIG. 14 is a timing chart illustrating an operation of the photodetector device according to Variation 3.

FIG. 14 is a timing chart illustrating an operation of the photodetector device 100C.

As illustrated in FIG. 14, the signal input control unit 1300 outputs, to the reference potential line 27, a pulse signal which repeats the potential Vofs and the potential Vofs2 in a constant cycle H.

<Observation>

The signal input control unit 1300 is smaller in circuit scale than the signal input control unit 600 according to Variation 2.

Accordingly, the photodetector device 100A can be miniaturized compared to the photodetector device B according to Variation 1.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely used in, for example, photodetector circuits which convert received light into electric signals.

The invention claimed is:

1. A photodetector circuit comprising:
   a photodetector transistor;
   a current output transistor;
   a switching transistor; and
   a first capacitor,
   wherein a source of the photodetector transistor, a gate of the current output transistor, and a first terminal of the first capacitor are connected to one another,
   a source of the current output transistor, a drain of the switching transistor, and a second terminal of the first capacitor are connected to one another,
   the photodetector transistor has a drain connected to a reference potential line, and upon receiving light when the photodetector transistor is in an off state, the source of the photodetector transistor collects electric charges generated by an internal photoelectric effect,
   the current output transistor has a drain connected to a power line which can have a first power supply potential and a second power supply potential, and
   the switching transistor has a source connected to a photodetection line.

2. The photodetector circuit according to claim 1, wherein the first power supply potential is for causing the source of the current output transistor to have a potential lower than a potential of the gate of the current output transistor by a threshold voltage of the current output transistor, and
   the second power supply potential is lower than the first power supply potential, and is for causing the source and the drain of the current output transistor to have an approximately same potential.

3. The photodetector circuit according to claim 1, wherein the source and the drain of the current output transistor have an approximately same potential in a photodetection period which is at least part of a period during which the photodetector transistor is in an off state.

4. The photodetector circuit according to claim further comprising
   a second capacitor connected to the second terminal and a fixed power supply.

5. The photodetector circuit according to claim 1, wherein the reference potential line can have a first reference potential and a second reference potential.

6. The photodetector circuit according to claim 5, wherein the second reference potential is higher than the first reference potential, and
   when the photodetector transistor is in an on state, the gate of the current output transistor has the first reference potential, and the source of the current output transistor has a first potential lower than the first reference potential by a threshold voltage of the current output transistor, the second reference potential is for causing the gate of the current output transistor to have the second reference potential to cause the source of the current output transistor to have a potential higher than the first potential.

7. A photodetector device comprising
a photodetector circuit array including a plurality of the photodetector circuits arrayed two-dimensionally in N rows and M columns, each of the photodetector circuits being the photodetector circuit according to claim 1, each of N and M being an integer greater than or equal to two,
wherein M photodetector circuits in each row are connected to a common reference potential line,
M photodetector circuits in each row are connected to a common power line, and
N photodetector circuits in each column are connected to a common photodetection line.

8. The photodetector device according to claim 7, further comprising
a reference potential line drive circuit which drives the reference potential lines for two or more rows at a same time.

* * * * *